United States Patent
Clocher et al.

[11] Patent Number: 5,838,545
[45] Date of Patent: Nov. 17, 1998

[54] HIGH PERFORMANCE, LOW COST MULTI-CHIP MODLE PACKAGE

[75] Inventors: Dennis F. Clocher, Milton; Glenn G. Daves, Beacon, both of N.Y.; Peter M. Elenius, Scotsdale, Ariz.; Joseph J. Lisowski, Hopewell Junction; Joseph M. Sullivan, Wappingers Falls, both of N.Y.

[73] Assignee: International Business Machines Corporation, Armonk, N.Y.

[21] Appl. No.: 733,154

[22] Filed: Oct. 17, 1996

[51] Int. Cl.⁶ ...................................... H05K 7/20
[52] U.S. Cl. ............................. 361/719; 257/668
[58] Field of Search ..................... 361/702, 704, 361/705, 722, 707–713, 717–720, 792, 795; 165/80.3, 185; 174/16.3, 252; 257/666, 668, 734, 773, 778, 713, 703–707

[56] References Cited

U.S. PATENT DOCUMENTS

| | | | |
|---|---|---|---|
| 3,675,089 | 7/1972 | Hantusch | 317/234 R |
| 4,796,077 | 1/1989 | Takeda et al. | |
| 4,989,117 | 1/1991 | Hernadez | |
| 5,198,885 | 3/1993 | Ibrahim | |
| 5,353,498 | 10/1994 | Fillion et al. | |
| 5,371,404 | 12/1994 | Juskey | 257/659 |
| 5,399,903 | 3/1995 | Rostoker et al. | |
| 5,455,448 | 10/1995 | Benjamin | 257/565 |
| 5,587,882 | 12/1996 | Patel | 361/705 |
| 5,602,720 | 2/1997 | Natsuhara | 361/708 |
| 5,675,183 | 10/1997 | Swamy | 257/723 |

OTHER PUBLICATIONS

J.K. Lake, et al., "High–Density Hermetic Module Frame Design," Research Disclosure, Aug. 1992, No. 340, 1 pg.

D. Chance, et al., "Hot Pressed Glass Ceramic on Aluminum Nitride Substrate," IBM Technical Disclosure Bulletin, vol. 35 No. 4A, Sep. 1992, 1 pg.

D.O. Powell, "Monolithic Ceramic Substrate and Heat Sink for Integrated Circuit Packages," IBM Technical Disclosure Bulletin, vol. 31 No. 11, Apr. 1989, 1 pg.

*Primary Examiner*—Gerald P. Tolin
*Attorney, Agent, or Firm*—Whitham, Curtis & Whitham; Steven J. Soucar

[57] ABSTRACT

A high performance, low cost multi-chip module package using a heatsink as a substrate with thin film wiring techniques or multilayered wiring techniques for interconnection of the chips on the surface of the module and a solder column grid array or solder ball grid array for interconnection to the next level of packaging (printed circuit board). The columns or balls create a space between the board and module with the chips being in the space and provide the required interconnect density.

3 Claims, 3 Drawing Sheets

HIGH PERFORMANCE, LOW COST MULTI-CHIP MODLE PACKAGE

BACKGROUND OF THE INVENTION

1. Field of the Invention

The present invention generally relates to semiconductor chip packaging and, more particularly, to multi-chip packages and the interconnecting of the chips within the package using thin film or internal substrate wiring.

2. Background Description

There is a need in the semiconductor packaging industry for high performance, low cost, small size multi-chip module packaging technology. Current solutions such as organic chip carriers, ceramic chip carriers or silicon chips on silicon substrates all have limitations related either to small size (as in quad flat packs where the interconnect to the next level is around the perimeter and takes up much space), limited thermal capability (ability to keep high power chips cool), or have a complex costly assembly process (with a separate base or stiffener, lids, covers and heat sinks), or a combination of all three factors.

A conventional module package is shown in FIG. 1 where a cross-section of a multi-chip "chip up" package of which only one chip is shown. An organic or ceramic substrate 1 with internal or surface wiring (integral wiring) is shown with a silicon chip 2. A lid or overmold 3 covers the substrate 1 and chip 2. A thermal adhesive 4 holds a heat sink 5 of cast or extruded aluminum to the lid 3. Thermal transfer of heat from the chip 2 to the lid 3 may be facilitated by a thermal grease 7 between the chip 2 and lid 3. Underneath the substrate 1 there are interconnect pins 6. Alternatively, columns or balls (not shown) can be used instead of pins. This package has a relatively complex assembly process with three parts; substrate/chip carrier, lid and heatsink.

FIG. 2 shows a cavity down module package, also known in the prior art. A downward cavity 13 is formed in an opening in the substrate 11. A slug 14 having good thermal conductivity is shown molded into the substrate and spanning the width of the cavity 13. Attached to the slug 14 on a side opposite the thermal adhesive 12 is a chip 15. A lid or overmold 16 spans the length of the cavity and is attached to the substrate 11 on either side of the cavity. Interconnect pins 17 are attached to the bottom portion of the substrate as in the "chip up" package described in FIG. 1. A heatsink 18 of cast or extruded aluminum is attached using heat sink adhesive 12 to the opposite side of the substrate 11. This package also has a relatively complex assembly process again with multiple parts; substrate/chip carrier, lid, heat slug and heatsink.

FIGS. 3A, 3B, and 3C show a top view, a front view, and a side view, respectively, of a silicon on silicon multi-chip module known in the prior art. Chips 21 are wire bonded or flip-chip bonded to a silicon substrate 22. The silicon substrate has thin film wiring circuitry on its top surface 23 to which the chips are connected and which interconnects the chips. Circuitry to be connected to the next level of assembly is routed to the perimeter of the silicon substrate and is then jumped by wired bonds 24 to a stiffener/carrier base 25 that has either perimeter surface mount contacts like a quad flat pack 26 (as shown in FIG. 3C) or pins 27 (as shown in FIG. 3B). The overall package may then be covered with a lid 28 and, if required, a heat sink 29. Thermal grease 30 may also be used to enhance the thermal path.

This package not only has a complex assembly process with many parts but also takes up a lot of space at the next level of assembly. A module package design that maintains or improves the thermal and electrical performance of current art while providing smaller size and lower cost is the goal of this invention.

A single chip module has been developed using wire bonding techniques on a heat sink which also acts as a substrate. See, for example, *IBM Technical Disclosure Bulletin*, Vol. 31, No. 11, April 1989. This technique is not applicable to multi-chip modules as it does not teach how to implement interchip wiring. The use of pins does not facilitate a dense interconnect structure as used in multi-chip production. The techniques also does not make use of flip-chip and thin film interconnect technologies.

What is needed, therefore, is a multi-chip module design that improves both the efficiency of the prior art heatsinks, adds minimal cost, and can accommodate a variety of chip interconnect technologies.

SUMMARY OF THE INVENTION

It is therefore an object of the present invention to provide a packaging technology which results in a low cost, high performance (thermal and electrical) package for multiple, high density chips.

It is another object of the invention to provide a packaging technology that is simple to manufacture (reduced steps, fewer parts) and small in size relative to current art.

According to the invention, there is provided the ability to treat a conventional heat sink as a chip carrier package and provide a normal surface mountable module to the next level of assembly without the cost, size or performance impacts of current industry standard practice. The base substrate is a heat sink/stiffener of cast or molded aluminum nitride, silicon carbide, or other material which can act as both a heat sink and substrate. Interconnection to a next level packaging is via solder balls or solder columns. Chip interconnection is via wire-bond or flip-chip via solder ball or column interconnect or thermal compression bonding or solder process for gold bumped wire/tab bond chips to permit flip-chip and wire/tab chips on the same substrate without the high cost of redistribution and flip-chip bumping for the wire bond/tab chips. The gold bumps are thermo compression bonded to the substrate or joined with a solder to this advantage. Interconnect between chips on the module and to the input/output connections (solder balls or columns) is via thin film wiring placed on the top surface of the heatsink/substrate or via multi-level ceramic wiring laminated into the top layers of the heatsink/substrate. The circuit/chip side of the module is protected by an epoxy or similar material. In this structure, the number of parts and the assembly of those parts is greatly simplified.

An alternative is to have a base substrate of thin films on silicon, diamond, aluminum or other suitable substrate material bonded to a heat sink/stiffener having a matched thermal coefficient of expansion. Interconnection is the same as if the base substrate was the heat sink/stiffener. In this structure, not only are there less parts and a simpler assembly process, but the resulting module is smaller.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
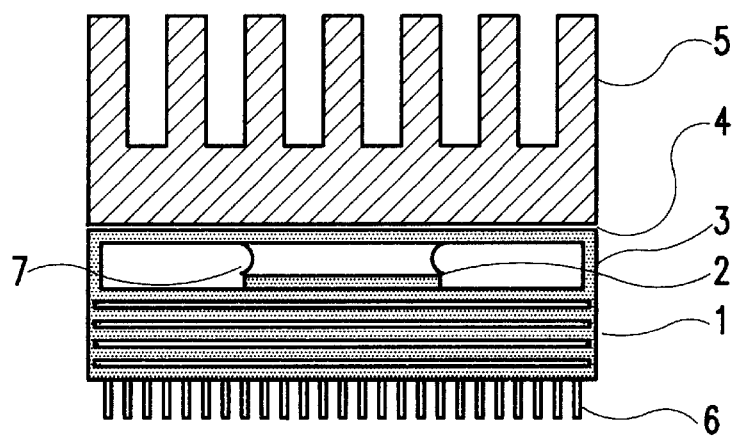
FIG. 1 is cross-sectional view of a chip up substrate as it is known in the prior art.
Figure 2:
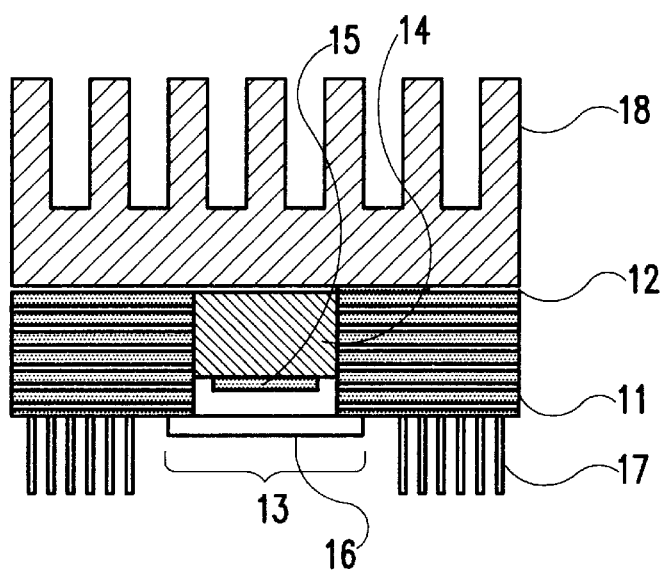
FIG. 2 is a cross-sectional view of a cavity down substrate as it is known in the prior art.
Figure 3:
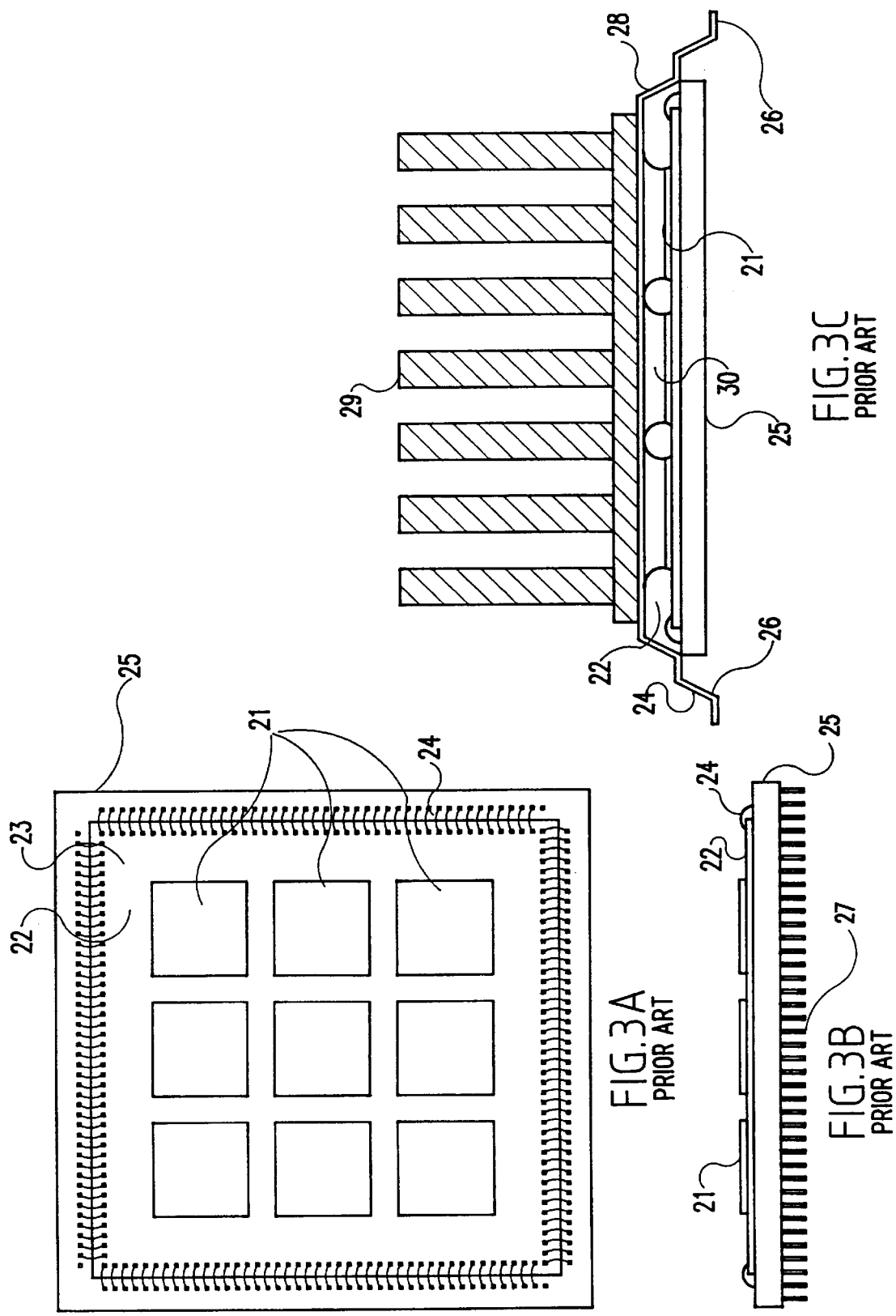
FIGS. 3A, 3B and 3C are, respectively, a top view, a front view and a side view of a silicon on silicon multi-chip module as it is known in the prior art.
Figure 4:
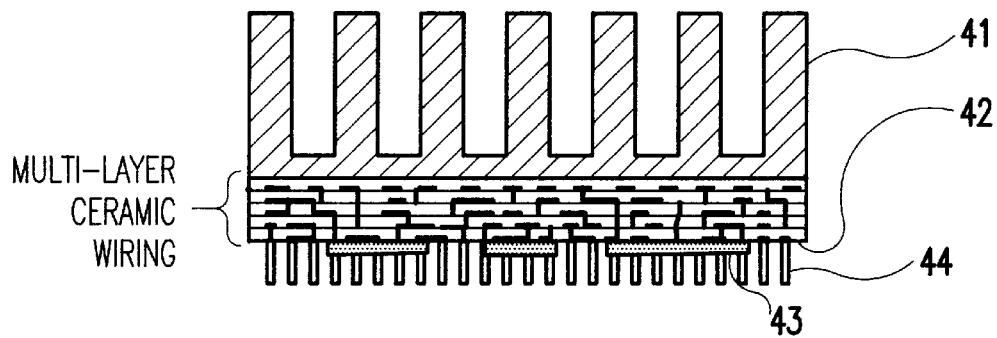
FIG. 4 is a cross-sectional view of the structure of the present invention.

Referring again to the drawings, and more particularly to FIG. 4, there is shown a side view in cross section of the inventive structure. The heat sink 41 of cast or extruded aluminum or other suitable material also acts as the substrate. Interconnect wiring is on the bottom surface 42 of the heatsink/substrate 41. Multiple chips 43 are mounted directly on the heatsink/substrate 41, by flip-chip, solder ball or gold bump interconnects or die bonding/wire bonding. An array of solder interconnects 44 (solder columns, solder balls or gold bumps) are attached to the same side of the heatsink/substrate 41 surrounding the chips 43 to create a space between the heatsink/substrate 41 and the next level of packaging (the printed circuit board, not shown) and act as the interconnect to the next level of packaging.

Figure 5:
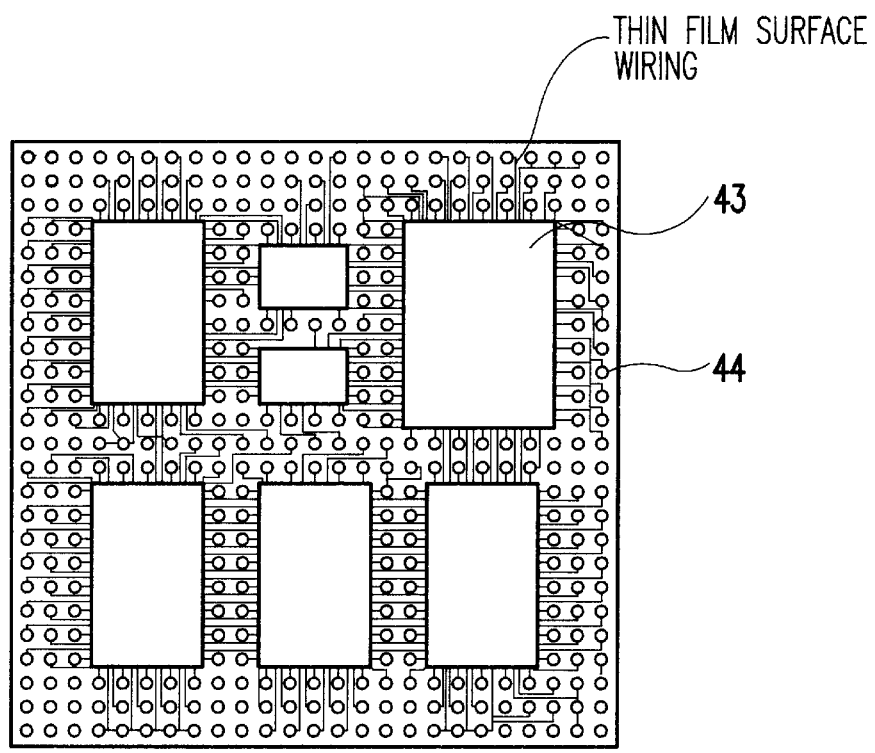
FIG. 5 is a bottom view of the structure of the present invention.

FIG. 5 shows a bottom view of the same multi-chip structure as in FIG. 4. This figure more clearly shows chips 43 of various sizes attached to the heatsink/substrate. An underfill or plastic may be used as required to strengthen bonding and protect the chips.

In both conventional techniques and in this invention, chips are attached and electrically interconnected to the next level of packaging with the following industry standard options.

WIRE BOND

The chip "backside" is bonded to the substrate through the use of a die bond adhesive or a metallurgical (e.g., solder) joint. The electrical interconnection is then made by bonding small wires of gold or aluminum between pads on the chip and pads on the substrate. The pads on the substrate are connected via circuitry to other chips. The wiring on the module may be surface and/or internal wiring such as found on printed circuit cards or multi layer ceramic substrates or thin films that are deposited in multiple layers with insulation between the layers, similar to the interconnect circuitry on a chip, either directly on the substrate or transferred to the substrate as a "decal". The interconnect to the next level of packaging may be surface mount tabs extending from the sides of the package or pins, or in the preferred embodiment, solder balls or solder columns in an array format on the bottom of the package.

FLIP CHIP

Flip chips generally have an array of small pads across the circuitry side of the chip or in a pattern around the perimeter of the circuit side of the chip. To these pads are attached the interconnect "balls." These balls may be made of solder, gold or other materials. The substrate has a matching set of pads to which the chip is placed and subsequently attached by use of solder, thermal bonding or an adhesive. The pads on the substrate to which the chip is attached are interconnected and connected to the next level of packaging in a similar manner to the wire bond process above.

With advanced silicon on silicon (or other substrate material such as aluminum or diamond) multi-chip module packages, the chips are die bonded/wire bonded or flip chip attached to the substrate and interconnected between chips and to the next level of interconnect via thin film wiring as described above. Since silicon, diamond, alumina or other substrates lack mechanical strength, they are typically bonded to a ceramic carrier or interposer which provides both mechanical enhancement and the interconnect to the next packaging level via edge tabs or pins. To electrically connect the substrate with chips to the carrier, perimeter wire bonding between pads on the substrate and pads on the carrier is performed. The substrate/carrier assembly is then generally covered with a lid and, if required, a heat sink added to the lid (see FIG. 4).

The disclosed package eliminates the need for the substrate to carrier perimeter wire bonding operation since solder balls or solder columns attached directly to the substrate around the chips provides this function. The lid and heatsink assembly operations are also eliminated since the chips can be protected via epoxy or plastic encapsulation directly on the substrate (this is possible because the chips will be between the substrate and next level of assembly, a printed circuit card, and not facing up exposed to handling damage) and the disclosed stiffener/carrier is also the heatsink.

In all cases, since the chips will be mounted on the substrate/chip carrier on the same side as the interconnect to the next level, they will be situated between the chip carrier and the printed circuit card. If enhanced thermal performance is required, a thermal path could be provided between the chip backside (as in flip chip technology) and the printed circuit card via a metal "spring" or thermally conductive elastomer or other known thermal enhancement technique.

The unique aspects of this disclosure are the combination of thin film wiring for chip to chip and input/output interconnect along with solder column or solder ball interconnect to the next level of assembly allowing the use of standard heatsinks as a single package component. Alternately, this disclosure allows for the use of the other heat sink material including but not limited to cast or molded aluminum nitride, multi-layer ceramic substrates laminated to molded, cast or extruded heatsinks or ceramic, aluminum, or other suitable material, silicon, diamond or other substrate material laminated to suitable heat sink material.

This combination provides a unique, low cost, small size, high performance multi-chip module package with potential for high demand across the electronics packaging industry.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A high performance multi-chip module package comprising:
   a heatsink having a heat dissipation surface and a chip carrier surface;
   a plurality of integrated circuit chips bonded to said chip carrier surface of said heatsink;
   electronic circuitry positioned on said chip carrier surface interconnecting said plurality of integrated circuit chips and interconnecting said plurality of integrated circuit chips to an array of interconnects which interconnect said electronic circuitry and said integrated circuit chips to a next level of packaging; and an array of interconnects bonded to said electronic circuitry on said carrier surface of said heat sink to connect said electronic circuitry and said integrated circuit chips to a next level of packaging, said array of interconnects including interconnect members positioned about the periphery of each of said plurality of integrated circuit chips and between adjacent integrated circuit chips of said plurality of integrated circuit ships.

2. The high performance multi-chip module of claim 1 wherein said electronic circuitry is multilayer.

3. The high performance multi-chip module of claim 1 wherein said interconnect members of said array of interconnects extend from said chip carrier surface of said heat sink a greater distance than said integrated circuit chips, thereby allowing for spacing from a next level of packaging.

\* \* \* \* \*

UNITED STATES PATENT AND TRADEMARK OFFICE
CERTIFICATE OF CORRECTION

PATENT NO.   : 5,838,545
DATED        : November 17, 1998
INVENTOR(S)  : Dennis F. Clocher, et al.

It is certified that error appears in the above-identified patent and that said Letters Patent is hereby corrected as shown below:

In the claims of the patent, in column 5, line 11 after the second "circuit", change "ships" to --chips--.

Signed and Sealed this

Twenty-third Day of March, 1999

Attest:

Q. TODD DICKINSON

Attesting Officer

Acting Commissioner of Patents and Trademarks

UNITED STATES PATENT AND TRADEMARK OFFICE
CERTIFICATE OF CORRECTION

PATENT NO. : 5,838,545
DATED : Nov. 17, 1998
INVENTOR(S) : Dennis F. Clocher, et al It is certified that error appears in the above-indentified patent and that said Letters Patent is hereby corrected as shown below:

On title page, item [54] and col. 1, lines 1-2, title should read as follows:

--HIGH PERFORMANCE, LOW COST MULTI-CHIP MODULE PACKAGE--

Signed and Sealed this

Second Day of November, 1999

Attest:

Q. TODD DICKINSON

Attesting Officer

Acting Commissioner of Patents and Trademarks